United States Patent [19]

Kausch et al.

[11] Patent Number: 4,756,988
[45] Date of Patent: Jul. 12, 1988

[54] MULTILAYER DRY-FILM NEGATIVE-ACTING PHOTORESIST

[75] Inventors: William L. Kausch, Cottage Grove; John P. Vikesland, Woodbury, both of Minn.

[73] Assignee: Minnesota Mining and Manufacturing Company, St. Paul, Minn.

[21] Appl. No.: 428,466

[22] Filed: Sep. 29, 1982

[51] Int. Cl.⁴ .................. G03C 1/94; G03C 5/00; G03C 1/68

[52] U.S. Cl. .................. 430/271; 430/258; 430/260; 430/273; 430/286; 430/285; 430/281; 430/533; 430/534; 430/961; 430/277; 430/939; 430/256; 430/257; 430/259; 430/299; 156/335; 156/327; 522/96

[58] Field of Search ........... 430/258, 260, 271, 271 A, 430/273, 286, 285, 281, 533, 534, 961, 277, 939, 256, 257, 259, 299; 204/159.16; 156/335, 332, 327; 427/388.3

[56] References Cited

U.S. PATENT DOCUMENTS

| | | | |
|---|---|---|---|
| 3,186,844 | 7/1962 | Alles et al. | 430/271 |
| 3,231,382 | 1/1966 | Silver | 430/271 |
| 3,469,982 | 9/1969 | Celeste | 96/35.1 |
| 3,526,504 | 9/1970 | Celeste | 430/285 X |
| 3,861,921 | 1/1975 | Hoffman et al. | 430/273 |
| 4,180,604 | 12/1979 | Feng et al. | 430/270 |
| 4,189,320 | 2/1980 | Hsich | 430/145 |
| 4,193,797 | 3/1980 | Cohen et al. | 430/258 |
| 4,204,009 | 5/1980 | Feng et al. | 427/36 |
| 4,349,620 | 9/1982 | Cyr et al. | 430/259 |
| 4,355,093 | 10/1982 | Hartmann et al. | 430/273 X |
| 4,360,560 | 11/1982 | Kopnick et al. | 156/335 X |

FOREIGN PATENT DOCUMENTS 1493833 11/1977 United Kingdom .

*Primary Examiner*—Roland E. Martin
*Assistant Examiner*—C. Hamilton
*Attorney, Agent, or Firm*—Donald M. Sell; Mark A. Litman

[57] ABSTRACT

Dry-film, negative-acting photoresist layers are used in the formation of many articles such as circuit boards, printing plates and the like. Laminable monolayers of photoresist can suffer from slow speeds, brittleness, variable adhesive characteristics, and narrow processing latitude during development and exposure. The use of a crosslinked or crosslinkable integral thermoplastic adhesive laer on the dry-film, negative-acting photoresist layer improves the properties and performance of the photoresist.

9 Claims, No Drawings

MULTILAYER DRY-FILM NEGATIVE-ACTING PHOTORESIST

FIELD OF THE INVENTION

The present invention relates to laminable dry-film, negative-acting photoresists. Such photoresists are useful for processes in which substrates are to be etched or are to have material deposited on the surface of the substrate in an imagewise fashion.

BACKGROUND OF THE INVENTION

Background of the Art

Initially, resists were applied to substrates in liquid form. The resist was imagewise subjected to radiation to form relatively soluble and relatively insoluble areas. Upon treatment with an appropriate developer solution, the relatively soluble areas were removed and a physical mask in the desired image pattern was left on the surface of the substrate. The exposed area of the substrate would then be treated by either deposition of material onto the exposed areas (e.g., metal deposition by vapor coating or electrolytic processes) or etching of the surface of the substrate in the area exposed through the mask.

One of the first advances in the use of dry-film photoresist materials was discussed in U.S. Pat. No. 3,469,982 in which a laminable negative-acting single layer film was adhered to a substrate and used as a photoresist.

U.S. Pat. No. 4,193,797 discloses the use of single layer laminable films of positive-acting dry-film photoresist compositions for use in photoresist processes.

U.S. Pat. No. 4,349,620 teaches multi-layer photosensitive film resists (positive and negative) consisting of a plurality of layers having different properties. Particularly disclosed is a carrier sheet, an adjacent first photosensitive layer, and a second photosensitive layer having different adhesion properties from the first layer.

Particular requirements in the positive-acting photoresist art have lead to the use of two layer or multilayer laminable sheets or coatings of photoresist materials in order to improve the sensitometric or physical properties of the dry-film resist. U.K. patent No. 1,493,833 shows the use of a photoresist comprising a carrier layer, a photosensitive layer (including positive-acting photosensitive layers) and a thermoplastic non-photosensitive layer which is soluble in aqueous or organic solvents. A host of natural and synthetic polymers are disclosed for these non-photosensitive layers. U.S. Pat. No. 4,204,009 discloses the use of a positive-acting resist having two photosensitive layers of different reactivities adjacent each other on top of the substrate to be treated. U.S. Pat. No. 4,217,407 discloses the use of multiple layer positive-acting resist materials which comprise an o-quinone diazide containing layer in combination with at least one other layer which is permeable, swellable, or soluble by alkaline envelopers. A brief list of non-photosensitive compositions is provided.

BRIEF DESCRIPTION OF THE INVENTION

The present invention relates to negative-acting, multilayer, laminable, dry-film photoresist articles which are useful in etching and plating processes. The laminable article comprises at least one negative-acting photoresist layer adhered to a thermoplastic adhesive second layer which is essentially non-photosensitive in the portion of the electromagnetic spectrum to which the negative-acting layer is sensitive. The second layer is crosslinked or crosslinkable to provide desired physical properties in the composite and in the bonding properties of that second layer. A strippable support layer on the other surface of the photoresist is desirably present.

DETAILED DESCRIPTION OF THE INVENTION

The present negative-acting, laminable dry-film photoresist article comprises at least two functional layers and optionally a strippable carrier layer. One functional layer is a preferably non-tacky, negative-acting dry-film photoresist composition and the second functional layer is a laminable crosslinked or crosslinkable adhesive layer.

Dry-film photoresist compositions are well described in the art. A polymeric binder usually carries within it a light-sensitive material, the solubility of which in selected solvents decreases when exposed to radiation.

The photoresist composition may be any negative-acting photosensitive resist material known in the art. Negative acting photosensitive resist systems ordinarily comprise a polymerizable composition which polymerizes in an imagewise fashion when irradiated, such as by exposure to light. These compositions are well reported in the literature and are commercially available. These compositions ordinarily comprise ethylenically or polyethylenically unsaturated polymerizable materials in combination with photosensitive free radical generators, although photosensitive epoxy systems with photoinitiated cationic polymerization catalysts are also known in the art. Preferably ethylenically unsaturated photopolymerizable systems are used, such as acrylate, methacrylate, acrylamide and allyl systems. Acrylic and methacrylic polymerizable systems of oligomers, trimers, dimers or monomers in combination with free radical photoinitiators are most preferred according to the practice of the present invention. U.S. Pat. Nos. 3,639,185; 4,349,620; 4,008,084; 4,138,262; 4,139,391; 4,158,079; and 3,469,982, disclose photosensitive compositions generally useful in the practice of the present invention. Non-polymerizable binders, dyes, pigments, antioxidants, filler, surfactants, antistatic agents, lubricants and other well known adjuvants may be present within the photoresist layer. Useful binders, for example, include acrylic resins (e.g., alkyl methacrylate, ethylacrylate, copolymers and the like) polymeric polyols (e.g., polyvinyl alcohol, and hydroxy substituted addition polyesters such as polyacrylate and polymethylacrylate polyesters), hydroxy substituted copolymers (such as poly[methyl methacrylate/hydroxy methylacrylate]), natural colloids (for example, gelatin and shellac), polyvinyl hydrogenphthalate, ethylene oxide polymers and copolymers, polyacrylamides, polyethylincally unsaturated materials (such as polystyrene and its copolymers), polyamides, polyesters, and the other various polymeric materials both natural and synthetic, thermoplastic and crosslinked as known in the art. The only requirement is that these materials have at least some reasonable solubility in aqueous alkaline or organic developer solutions. The thickness of the photosensitive layer may generally be between 0.05 and 2.0 mils, preferably between 0.10 and 0.50 mils, most preferably at least 0.1 and less than 0.3 mils.

The thermoplastic adhesive layer is essential to the negative-acting photoresist technology of the present invention. Monolayer constructions have needed improvement in the areas of (1) resistance to crazing of the film during storage, (2) photosensitivity, the speed of the film being too slow for commercial processes, (3) the need for using alkoxysilane adhesion promoters, and especially (4) thermal dimensional stability of the film during plating and etching processes. The use of the distinct, non-photosensitive adhesive layer to make the photoresist article laminable improves performance with respect to all three of these problems. It is the presence of the integral adhesive layer between the photoresist layer and the receptor layer which improves negative-acting, dry-film photoresist technology, while monolayer constructions have not fully satisfied the needs of the technology.

The ability to avoid using alkoxysilane adhesion promoters in the resist layer is particularly noteworthy. Those materials are notoriously difficult to work with. Minor variations of concentration of those promoters provide sufficient adhesion while an excess causes gumming or improper cleanoff of the receptor surface which prevents immediate use of the surface for plating or etching. Active amounts of the alkoxysilane are therefore not necessary in either layer.

The crosslinked or crosslinkable laminable layer may be made of any compositions which are soluble in aqueous alkaline or organic solvent solutions and are not sufficiently crosslinked so as to prevent bonding of that layer to a substrate when pressed and heated. Typically, the crosslinked or crosslinkable layer should be capable of adhering to at least one substrate of mildly abraded copper, aluminum, tin, or polyester when pressed against such a surface with a force of no more than ten pounds per square inch at a temperature no greater than 150° C. for no longer than twenty seconds. These characteristics define the term laminable in the practice of the present invention. The crosslinkable resin may already be crosslinked to any degree consistent with its also being laminable and yet be capable of further crosslinkability. This can be achieved by various means known to the ordinarily skilled artisan such as inclusion of photoactivatable crosslinking agents, partial crosslinking of the original composition which may be further crosslinked by heating, etc.

The necessity for crosslinking or crosslinkability in the laminable layer derives from the fact that the many various applications of the dry-film photoresist article will require different properties in the various applications. This is why the crosslinkable ability of the layer, which is controlable by the degree of crosslinking stimulation given that layer, is the preferred embodiment of the present invention. Crosslinking is an improvement over the general use of thermoplastic materials as the laminable layer in the prior art because of the improved control of solubility which can be given those layers and the control of dimensional stability provided. The crosslinkable compositions must be crosslinkable to a degree that satisfies the definition of crosslinked according to the present invention.

The control of solubility in thermoplastic, non-crosslinked laminable layers quickly reaches a point of diminishing returns. Particularly when organic solvents are being used as a developer, increasing the molecular weight of thermoplastic polymers used in the laminable layer becomes more difficult and less productive in reducing the natural solubility of that layer in developer solvents. Doubling the molecular weight of a thermoplastic polymer from 500,000 to a million, for example, does not provide for facile control of solubility properties and does not easily produce a polymer with consistent properties because of the significant distribution of molecular weights within the polymerized material. Controlled crosslinking, on the other hand, tends to provide a more consistent composition with more accurately controlled solubility properties. This is particularly true with respect to thermal dimensional stability in the laminated resist which is extremely important in many fine detail processes where elevated temperatures are used, such as in plating processes.

Any polymeric material which can be crosslinked and in its incompletely crosslinked stage (i.e., at least partially crosslinked), is soluble in aqueous alkaline solutions or organic solvents is useful in the practice of the present invention. By crosslinked, it is understood that the polymeric composition has at least some three dimensional structure to it and is at least ten percent (preferably at least 15 or 20 percent and more preferably 25 or 50 percent) less soluble in the selected developer solution (e.g., aqueous NaOH at pH 13.5) than the polymeric composition without the crosslinking therein. Amongst the various classes of materials that can be used for the laminable layer are phenol formaldelhyde resins (including novolaks), epoxy resins, acrylic resins (homopolymers, copolymers, terpolymers, and the like), polyesters, polyamides, and the like. Each of these materials is well known in the art to be crosslinkable, and the skilled artisan is well aware of the various crosslinking agents which can be used for the various polymeric materials. These, for example, include diisocyanates (and polyisocyanates) and epoxies, diacid chlorides, dianhydrides, diacids, polyisocyanates, polyepoxides, polyacids, aziridines, azlactones, dihalides, polyhalides, and the like. When already crosslinked, the laminable layer must remain laminable. No crosslinked layer should be in combination with the photosensitive resist layer prior to lamination if it is so crosslinked that it is neither laminable nor soluble in either aqueous alkaline solutions or organic solvent solutions. This control is well understood by those of ordinary skill in the art and can be determined for any crosslinkable material and any particular crosslinking agent by routine experimentation. Mixtures of these crosslinkable materials together or in combination with thermoplastic materials may be readily practiced by one of ordinary skill in the art. For example, the composition of U.S. Pat. No. 4,247,616 may be used as the laminable layer (without photosensitizer present for the negative-acting photoresist. The preferred compositions of the present invention for the laminable layer comprise phenol formaldehyde resins blended with acrylic resins and particularly resole resins and acrylic terpolymers. A typical developer solution for determining relative solubility for crosslinked materials, as defined above, would be aqueous sodium hydroxide solutions of pH 13.0 to 13.5.

The photosensitive and laminable layers may vary in thickness depending on their particular needs. Generally the various layers will range from 0.05 to 50 microns, preferably from 0.05 to 5 microns, and most preferably from 0.08 to 3 microns for the photosensitive resist layer. The other, non-sensitive, laminable crosslinked or crosslinkable layer may be of the same, smaller, or larger thickness, but should remain within the broad limits given for the photosensitive resist layer.

Various other ingredients may be included in these layers as is well understood in the art. Surfactants, spectral sensitizers, dyes, fillers, lubricants, coating aids, spectral absorbers (such as ultraviolet radiation absorbers) and the like may be used as is understood in the art. These and other aspects of the present invention will be disclosed in the following examples.

EXAMPLE 1

Practice of the invention is illustrated in the following example. The photosensitive layer was coated onto a polyester film bearing a release coating of Gantrez S-95 an acidified copolymer of a maleic anhydride and methyl vinyl ether. The drying temperature was 75° C. for 1.5 minutes. The dry thickness of the photosensitive layer was 0.15 mil. The photosensitive coating was made from a 11% solids solution in a solvent of (50%) ethylene dichloride and (50%) methyl ethyl ketone of the following composition:

30%—pentaerythritoltetramethacrylate
33%—SMA 17362, a partially esterified styrene-maleic anhydride copolymer
20%—the reaction product of G-cure 867, a hydroxy-functional acrylic copolymer, and isocyanato ethyl methacrylate
3%—U-34, an acrylate functional urethane oligomer containing acid groups made according to U.S. Pat. No. 4,228,232 (Preparation V)
6%—1:2 mixture of Michler's Ketone and diphenyliodonium hexafluoro phosphate
5%—of an s-triazine free radical photoinitiator
3%—pigment and inert binder resin The photosensitive coating was then overcoated with the nonphotosensitive coating using a 20% solids solution in acetone of the reacted composition:

69%—BKR 2620, a resole type phenol-formaldehyde resin
0.6%—Triethylenediamine
1.6%—a 36 carbon atom aliphatic diisocyanate
2.4%—Phenylisocyanate
26%—Carboset 525, an ethyl acrylate, methyl acrylate, and acrylic acid terpolymer
0.4%—Rhodamine B—a dye The nonphotosensitive coating was dried at 100° C. for 2 minutes and had a dry thickness of about 0.3 mil. The dry-film was laminated at 3 ft/min to copper foil using a heated-roll laminator set at 110° C. The laminated resist was exposed through a photomask and developed with an approximately 1.0% solution of sodium hydroxide. The unexposed areas were removed and the resulting image was very good.

EXAMPLES 2–4

In addition to the above example, the following nonphotosensitive compositions have also been successfully employed.

| | | |
|---|---|---|
| A. | 38.1 g | Acetone |
| | 5.1 g | BKR 2620 |
| | 3.1 g | Carboset 525 |
| | 0.13 g | Gantrez AN119, (maleic anhydride, methyl vinyl ether copolymer) |
| B. | 40 g | Acetone |
| | 0.05 g | Triethylene diamine |
| | 5.4 g | BKR 2620 |
| | 0.1 g | Phenylisocyanate |
| | 2.0 g | Carboset 525 |
| C. | 50 g | Toluene |
| | 10 g | Acryloid AT-70 |
| | 1.4 g | DER-732 |
| | 0.3 g | Methanesulfonic acid |

Compositions B and C are crosslinkable compositions. When initially laminated, the compositions were capable of being undercut by development. By heating the laminated composition, the crosslinking reaction was initiated and various degrees of crosslinking could be generated. In this manner the precise degree of undercutting of the mask or image could be controlled offering a highly desirable degree of latitude in processing. Heating of composition B at 250° F. for fifteen minutes after lamination produced an adhesive layer that was barely undercut by the developer (aqueous alkaline solution at pH 13+).

What is claimed is:

1. A dry-film, negative-acting, laminable photoresist of at least two layers comprising:
   (a) a first layer of a negative-acting photosensitive resist composition comprising (1) an ethylenically unsaturated acrylic or methacrylic polymerizable oligomer, dimer or monomer and (2) a photosensitive free radical generator, said first layer becoming less soluble in an aqueous alkaline solution or organic solvent after exposure to actinic radiation, and
   (b) a laminable second layer, adjacent and adhered to a surface of said first layer, of a laminable crosslinked or crosslinkable organic polymer which is soluble in an aqueous alkaline solution or organic solvent, wherein said organic polymer comprises an acrylic polymer.

2. The photoresist of claim 1 wherein said second layer comprises (1) an acrylic copolymer or terpolymer and (2) a phenol formaldehyde resin crosslinked with a polyisocyanate.

3. A dry-film, negative-acting, laminable photoresist of at least two layers comprising:
   (a) a first layer of a negative-active photosensitive resist composition comprising an ethylenically unsaturated material and a photosensitive free radical generator, said first layer becoming less soluble in an aqueous alkaline solution or organic solvent after exposure to actinic radiation, and
   (b) a second layer, adjacent and adhered to a surface of said first layer, of a laminable crosslinked or crosslinkable organic polymer which is soluble in an aqueous alkaline solution or organic solvent, wherein said organic polymer of said second layer comprises a phenol formaldehyde resin and an acrylic polymer.

4. A dry-film, negative-acting, laminable photoresist of at least two layers comprising:
   (a) a first layer of a negative-acting photosensitive resist composition, said first layer becoming less soluble in an aqeuous alkaline solution or organic solvent after exposure to actinic radiation, and
   (b) a second layer, adjacent and adhered to a surface of said first layer, of a laminable crosslinked or crosslinkable organic polymer crosslinkable by the applicaiton of heat thereto which is soluble in an aqueous alkaline solution or organic solvent, wherein said organic polymer of said second layer comprises a phenol formaldehyde resin and an acrylic polymer.

5. A dry-film negative-acting, laminable photoresist consisting essentially of two layers comprising:
   (a) on one surface of said photoresist a first layer of a negative-acting photosensitive resist composition, said first layer becoming less soluble in an aqueous alkaline solution or organic solvent after exposure to actinic radiation, and (b) on the second surface of said photoresist a laminable second layer, adjacent and adhered to a surface of said first layer, of a laminable crosslinked or crosslinkable organic polymer which is soluble in an aqueous alkaline solution or organic solvent wherein said organic polymer of said second layer comprises a phenol formaldehyde resin and an acrylic polymer.

6. A dry-film, negative-acting, laminable photoresist consisting essential of three layers comprising:

(a) a first layer of a negative-acting photosensitive resist composition, said first layer becoming less soluble in an aqueous alkaline solution or organic solvent after exposure to actinic radiation, (b) a laminable second layer, adjacent and adhered to a surface of said first layer, of a laminable crosslinked or crosslinkable organic polymer which is soluble in an aqueous alkaline solution or organic solvent, and (c) a strippable carrier layer adhered to said first layer wherein said organic polymer of said second layer comprises a phenol formaldehyde resin and an acrylic polymer.

7. The photoresist of claim 5 wherein said photoresist layer comprises an ethylenically unsaturated material and a photosensitive free radical generator and wherein said organic polymer of said second layer comprises a phenol formaldehyde resin and an acrylic polymer.

8. The photoresist of claim 7 wherein said ethylenically unsaturated material comprises an acrylic or methacrylic polymerizable oligomer, dimer or monomer and wherein the organic polymer of said second layer comprises an acrylic polymer.

9. The photoresist of claim 8 wherein said organic polymer of said second layer comprises a phenol formaldehyde resin and an acrylic polymer.

* * * * *